(12) United States Patent
Arvelo et al.

(10) Patent No.: US 7,928,562 B2
(45) Date of Patent: Apr. 19, 2011

(54) SEGMENTATION OF A DIE STACK FOR 3D PACKAGING THERMAL MANAGEMENT

(75) Inventors: Amilcar R. Arvelo, Poughkeepsie, NY (US); Evan G. Colgan, Chestnut Ridge, NY (US); John H. Magerlein, Yorktown Heights, NY (US); Kenneth C. Marston, Poughquag, NY (US); Kathryn C. Rivera, Hopewell Junction, NY (US); Kamal K. Sikka, Poughkeepsie, NY (US); Jamil A. Wakil, Austin, TX (US); Xiaojin Wei, Fishkill, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 12/177,194

(22) Filed: Jul. 22, 2008

(65) Prior Publication Data
US 2010/0019377 A1 Jan. 28, 2010

(51) Int. Cl.
*H01L 23/36* (2006.01)

(52) U.S. Cl. .......... 257/712; 257/E23.101; 257/675; 257/713; 257/717; 257/720; 257/704; 257/706; 257/707; 257/710; 257/686; 257/685; 257/723; 257/777; 257/774; 257/724; 257/725

(58) Field of Classification Search .......... 257/712, 257/713, 717, 720, 675, 704, 706, 707, 710, 257/686, 685, 723, 777, E23.101, E23.5, 257/774, 724, 725; 174/526; 361/705, 718
See application file for complete search history.

(56) References Cited

U.S. PATENT DOCUMENTS

| | | | | |
|---|---|---|---|---|
| 5,604,978 A | * | 2/1997 | Sherif et al. | 29/840 |
| 5,623,394 A | * | 4/1997 | Sherif et al. | 361/705 |
| 5,724,729 A | * | 3/1998 | Sherif et al. | 29/840 |
| 5,783,026 A | * | 7/1998 | Natarajan et al. | 156/378 |
| 5,933,323 A | * | 8/1999 | Bhatia et al. | 361/700 |
| 6,281,573 B1 | * | 8/2001 | Atwood et al. | 257/706 |
| 6,294,408 B1 | * | 9/2001 | Edwards et al. | 438/121 |
| 6,373,133 B1 | * | 4/2002 | DiGiacomo et al. | 257/713 |
| 6,706,562 B2 | * | 3/2004 | Mahajan et al. | 438/125 |

(Continued)

OTHER PUBLICATIONS

Patrick Coico; "Method and Structure to Improve Thermal Dissipation from Semiconductor Devices", filed Mar. 5, 2007 as U.S. Appl. No. 11/681,994.

*Primary Examiner* — Alexander O Williams
(74) *Attorney, Agent, or Firm* — Cantor Colburn LLP; Joseph Petrokaitis

(57) ABSTRACT

An apparatus to reduce a thermal penalty of a three-dimensional (3D) die stack for use in a computing environment is provided and includes a substrate installed within the computing environment, a first component to perform operations of the computing environment, which is coupled to the substrate in a stacking direction, a set of second components to perform operations of the computing environment, each of which is coupled to the first component and segmented with respect to one another to form a vacated region, a thermal interface material (TIM) disposed on exposed surfaces of the first and second components, and a lid, including a protrusion, coupled to the substrate to overlay the first and second components such that the protrusion extends into the vacated region and such that surfaces of the lid and the protrusion thermally communicate with the first and second components via the TIM.

18 Claims, 11 Drawing Sheets

U.S. PATENT DOCUMENTS

| | | | |
|---|---|---|---|
| 6,831,836 B2 * | 12/2004 | Bhatia et al. | 361/705 |
| 6,939,742 B2 * | 9/2005 | Bhatia et al. | 438/117 |
| 7,126,218 B1 * | 10/2006 | Darveaux et al. | 257/706 |
| 7,335,534 B2 * | 2/2008 | Pavio | 438/122 |
| 7,345,885 B2 * | 3/2008 | Boudreaux et al. | 361/721 |
| 7,362,580 B2 * | 4/2008 | Hua et al. | 361/709 |
| 7,394,659 B2 * | 7/2008 | Colgan et al. | 361/718 |
| 7,527,090 B2 * | 5/2009 | Dani et al. | 165/185 |
| 7,741,153 B2 * | 6/2010 | Caron et al. | 438/109 |
| 7,781,682 B2 * | 8/2010 | Bahadur et al. | 174/526 |
| 7,781,883 B2 * | 8/2010 | Sri-Jayantha et al. | 257/712 |
| 2002/0000239 A1 * | 1/2002 | Sachdev et al. | 134/2 |
| 2002/0105071 A1 * | 8/2002 | Mahajan et al. | 257/720 |
| 2004/0188814 A1 * | 9/2004 | Houle et al. | 257/678 |
| 2004/0190252 A1 * | 9/2004 | Prasher et al. | 361/699 |
| 2005/0139998 A1 * | 6/2005 | Fitzgerald et al. | 257/713 |
| 2006/0180924 A1 * | 8/2006 | Andry et al. | 257/712 |
| 2007/0241449 A1 * | 10/2007 | Colbert et al. | 257/706 |
| 2008/0128897 A1 * | 6/2008 | Chao | 257/713 |
| 2008/0179755 A1 * | 7/2008 | Andry et al. | 257/774 |
| 2008/0231311 A1 * | 9/2008 | Condorelli et al. | 324/765 |
| 2008/0282114 A1 * | 11/2008 | Knickerbocker et al. | 714/47 |
| 2009/0057884 A1 * | 3/2009 | Too et al. | 257/723 |
| 2009/0085183 A1 * | 4/2009 | Mitchell et al. | 257/686 |
| 2009/0193652 A1 * | 8/2009 | Salmon | 29/831 |
| 2009/0219698 A1 * | 9/2009 | Chao | 361/718 |
| 2009/0261472 A1 * | 10/2009 | Bayerer | 257/719 |
| 2009/0298236 A1 * | 12/2009 | Dang et al. | 438/121 |
| 2010/0044856 A1 * | 2/2010 | Sri-Jayantha et al. | 257/717 |
| 2010/0181644 A1 * | 7/2010 | Toong et al. | 257/532 |
| 2010/0230805 A1 * | 9/2010 | Refai-Ahmed | 257/712 |

* cited by examiner

SEGMENTATION OF A DIE STACK FOR 3D PACKAGING THERMAL MANAGEMENT

BACKGROUND OF THE INVENTION

1. Field of the Invention

Aspects of the present invention are directed to three-dimensional (3D) packaging thermal management and, more particularly, to a segmentation of a die stack for 3D packaging thermal management.

2. Description of the Background

Generally, an electronic package is a hardware component in which active devices, such as logic or memory devices, and passive devices, such as resistors and capacitors, are enclosed. The electronic package performs functions of an electronic system, such as those used inside a mobile phone, a personal computer, a digital music player, etc. Common electronic packages are classified as either flip-chip or wire-bond packages.

In a typical flip-chip electronic package, as shown in FIG. 1, a single die 10 is joined to a chip carrier 100 or substrate though electrical interconnects 130 called controlled collapse chip connections (C4) bumps. The chip carrier 100 is either a ceramic or organic material. The C4 may be encapsulated in an underfill material 160. A lid 120 (e.g., a cap or a hat) can be used to provide thermal cooling and/or mechanical protection. A thermal interface material (TIM) 150, which can be an elastomer, adhesive, gel or metal, may be disposed between the chip 10 and the lid 120. A bond 170, such as an elastomer, epoxy or mechanical fasteners, may be used to attach the lid 120 to the chip carrier 100. The chip carrier 100 may be further coupled to a secondary carrier 110 or a printed circuit board (PCB) via leads 140.

In order to increase bandwidth and function, one particular construction of an electronic package, which is shown in FIG. 2, involves horizontally attaching multiple dies 11, 12, 13 and 14 to a multi-chip-carrier 101. Here, the electronic package grows in dimension to accommodate the multiple dies 11, 12, 13 and 14 and presents cost and size-related reliability issues. In another construction of an electronic package, which is shown in FIG. 3, multiple dies 15 and 16-18 are vertically stacked onto a single-chip carrier 102.

Since a set of chips, resistors, capacitors and/or memory units may be provided in a particular die stack, it may be a complete functional unit requiring few external components. As such, use of the die stack in space-constrained environments, such as mobile phones and computers, may be valuable. Also, a stacked die can provide an increased electrical interconnect density with less latency and lower power consumption, which can greatly increase system performance. This is especially true with "multicore" chips where it is difficult to increase the bandwidth to memory adequately.

Despite its benefits, however, a problem with a die stack exists in that the upper die provides a thermal resistance along the primary heat flow path from the die stack and into the cooling lid (e.g., the lid 120 of FIG. 1). During normal operations, this thermal resistance causes an internal temperature of an electronic package with a die stack to increase as compared to that of a non-stacked electronic package. As a result, a performance of the electronic package with a die stack may be degraded.

SUMMARY OF THE INVENTION

In accordance with an aspect of the invention, an apparatus to reduce a thermal penalty of a three-dimensional (3D) die stack for use in a computing environment is provided and includes a substrate installed within the computing environment, a first component to perform operations of the computing environment, which is coupled to the substrate in a stacking direction, a set of second components to perform operations of the computing environment, each of which is coupled to the first component and segmented with respect to one another to form a vacated region, a thermal interface material (TIM) disposed on exposed surfaces of the first and second components, and a lid, including a protrusion, coupled to the substrate to overlay the first and second components such that the protrusion extends into the vacated region and such that surfaces of the lid and the protrusion thermally communicate with the first and second components via the TIM.

In accordance with another aspect of the invention, a three-dimensional (3D) die stack is provided and includes a first component, a set of one or more second components, each of which is coupled to the first component and segmented with respect to one another to form a vacated region, a thermal interface material (TIM) disposed on exposed surfaces of the first and second components, and a lid, including a protrusion, configured to overlay the first and second components such that the protrusion extends into the vacated region and such that surfaces of the lid and the protrusion thermally communicate with the first and second components via the TIM.

In accordance with yet another aspect of the invention, a three-dimensional (3D) die stack is provided and includes a first component, a set of one or more second components, each of which is coupled to the first component and segmented with respect to one another to form a vacated region, a set of one or more third components, each of which is coupled to a respective second component and segmented with respect to one another to form an additional vacated region, a thermal interface material (TIM) disposed on exposed surfaces of the first, second and third components, and a lid, including a protrusion, configured to overlay the first, second and third components such that the protrusion extends into the vacated region and the additional vacated region and such that surfaces of the lid and the protrusion thermally communicate with the first, second and third components via the TIM.

BRIEF DESCRIPTIONS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION OF THE INVENTION

Figure 1:
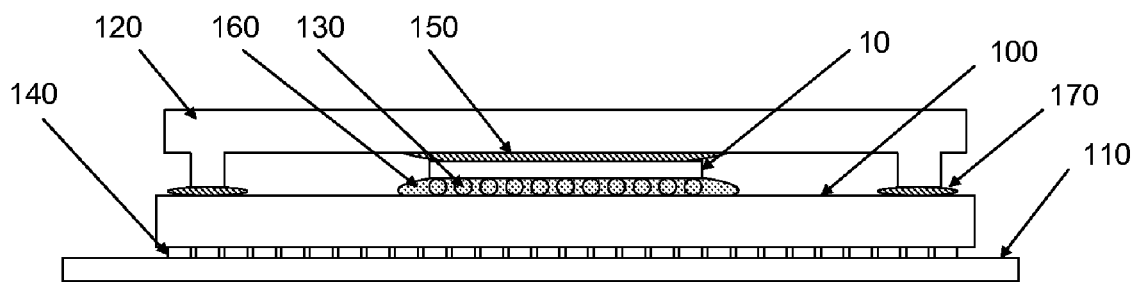
FIG. 1 is a cross-sectional view of a typical flip-chip electronic package with a single die.
Figure 2:
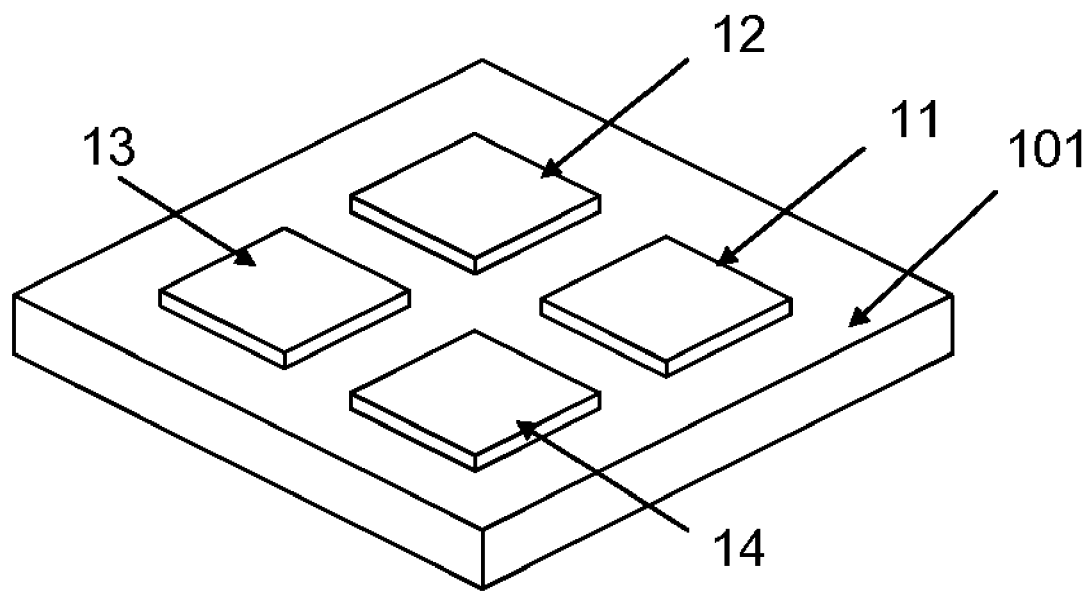
FIG. 2 is a perspective view of multiple dies arranged horizontally on a chip carrier.
Figure 3:
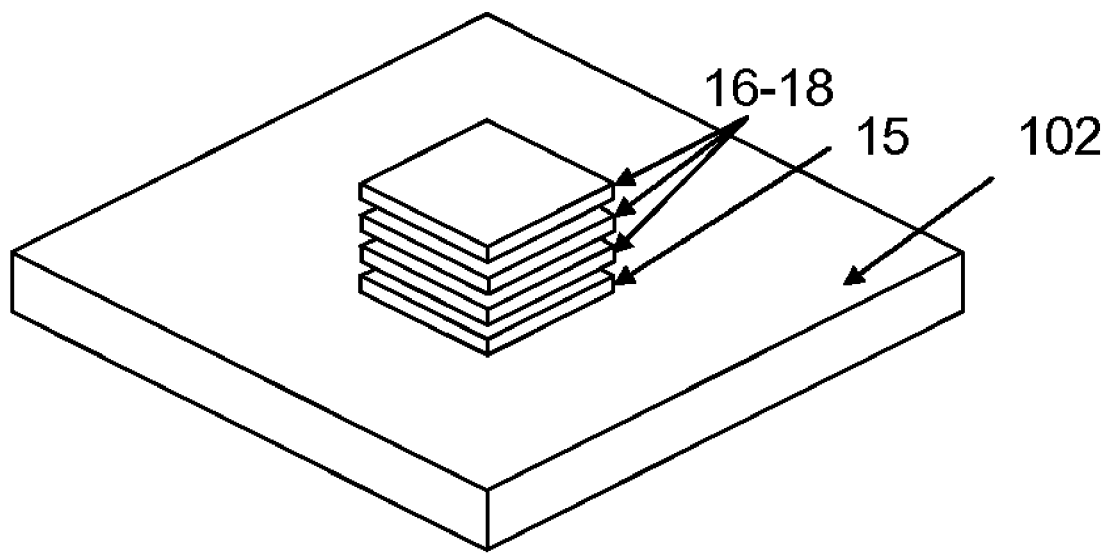
FIG. 3 is a perspective view of multiple dies arranged vertically in a die stack.

With reference to FIGS. 4A-6, an apparatus 1000 is provided that is able to reduce a thermal penalty of a three-dimensional (3D) die stack 200 for use in a computing environment by allowing for efficient cooling of the die stack 200. The thermal penalty refers to the degree by which upper layers of the die stack 200 provide a thermal resistance to heat flow along a thermal path through the die stack 200. As noted above, where the thermal penalty of a die stack 200 is high, the thermal resistance is also high and heat flow is impeded. In this situation, a temperature of the die stack 200 may increase and performance degradation or other similar failures may occur.

The apparatus 1000 includes a substrate 300 installed within the computing environment and a first component 201 to perform operations, such as computing operations for the computing environment. The first component 201 is coupled to the substrate 300 in a stacking direction that is substantially parallel with the thermal path. That is, the thermal path is defined to extend away from the first component 201 and is parallel with a direction that is substantially normal to a plane of the substrate 300. Conversely, a predominant path of the thermal resistance is defined to extend in the opposite direction.

One or more second components 210, 220, 230 and 240 are also configured to perform operations and are coupled to the first component 201 to thereby form an upper layer of the die stack 200. The second components 210, 220, 230 and 240 are formed by having been segmented and, as such, they cooperate to form a vacated region 202 between them and along the stacking direction. A thermal interface material (TIM) 350 (see FIG. 5A), through which the thermal path extends, is disposed on a top surface of the first component 201 in the vacated region 202 and on top surfaces of the second components 210, 220, 230 and 240. A lid 500, such as a cooling cap, is positioned in thermal communication with the TIM 350 and forms an exterior appearance of the die stack 200.

The lid 500 includes one or more protrusions 501 that extend into the vacated region 202 to nearly contact an exposed top surface of the first component 201. The lid 500 and the protrusion 501 further include surfaces that thermally communicate with at least the TIM 350. With this arrangement, the lid 500 and the protrusions 501 are configured to remove heat that is generated within the first and second components 201 and 210-240 during the operations from the first and second components 201 and 210-240 via the TIM 350.

In accordance with embodiments of the invention, the substrate 300 may include a printed circuit board (PCB) to which the die stack 200 is electronically coupled and which is operably installed within the computing environment. In addition, an intermediate layer may be disposed between the die stack 200 and the substrate 300. This intermediate layer may be coupled to the substrate 300 via electrical leads and may include a power regulating layer, which is configured to regulate power applied to the die stack 200, and/or a silicon carrier, which is provided with an integrated decoupling capacitance (DECAP).

In accordance with further embodiments of the invention, the first component 201 may include a processor. Here, the operations performed by the first component 201 may include computational operations related to the operation of the computing environment. Concurrently, the one or more second components 210, 220, 230 and 240 may include an additional processor and/or a memory unit, including at least one of a static random access memory (SRAM) and a dynamic random access memory (DRAM). Here, as shown in FIG. 6 and as will be discussed below, it is noted that the die stack 200 may include additional layers not shown in FIGS. 4A-5C.

The first component 201 is both electrically and structurally coupled to the substrate 300. The electrical coupling may be accomplished via electrical interconnects, such as controlled collapse chip connections (C4) bumps, which may be encapsulated in an underfill material, such as epoxy resin or some other suitable adhesive. The second components 210-240 are coupled to the first component 201 both electrically and structurally in generally similar manners. However, in this case, a pitch (i.e., a density) of the electrical interconnects may be significantly higher than the coupling between the first component 201 and the substrate 300. An inter-chip region may, therefore, be formed between the first and second components 201 and 210-240.

During standard operations of the first component 201, which may include a testing phase and/or a normal operational phase, it may be seen that at least one hot spot may form across an X-Y plane of the die stack 200 as a result of the thermal resistance to the heat flow along the thermal path. The presence of such a hot spot may be predicted based upon the architecture of the first and second components 201 and 210-240 or may be observed during the standard operations thereof.

According to embodiments of the invention, the second components 210-240 are segmented so as to allow the lid 500 and the protrusions 501, which extend into the vacated region 202 formed by the segmented second components 210-240, to remove heat from the first and second components 201 and 210-240 via the TIM 350 to thereby limit a size and/or an intensity of the hot spot. In further embodiments of the invention, the second components 210-240 are to be segmented in a particular pattern that allows the lid 500 and the protrusions 501 to be precisely positioned proximate the hot spot. In this way, the lid 500 and the protrusions 501 may be particularly positioned to remove heat from those particular portions of the first and second components 201 and 210-240 that form the hot spot.

Figure 4A:
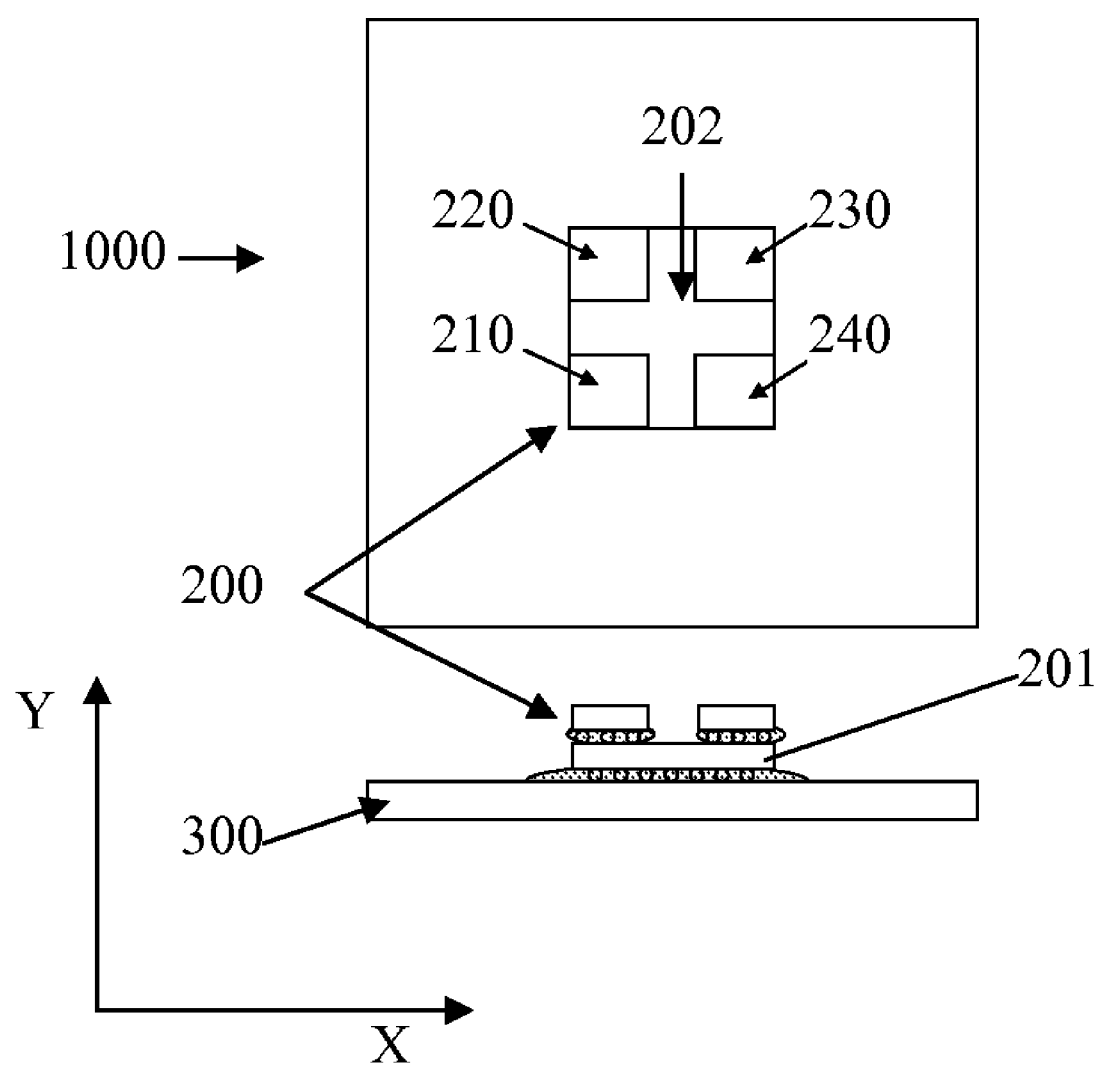
FIG. 4A shows top and cross-sectional views of an electronic package with a vertical die stack that is segmented according to an embodiment of the invention.
Figure 5A:
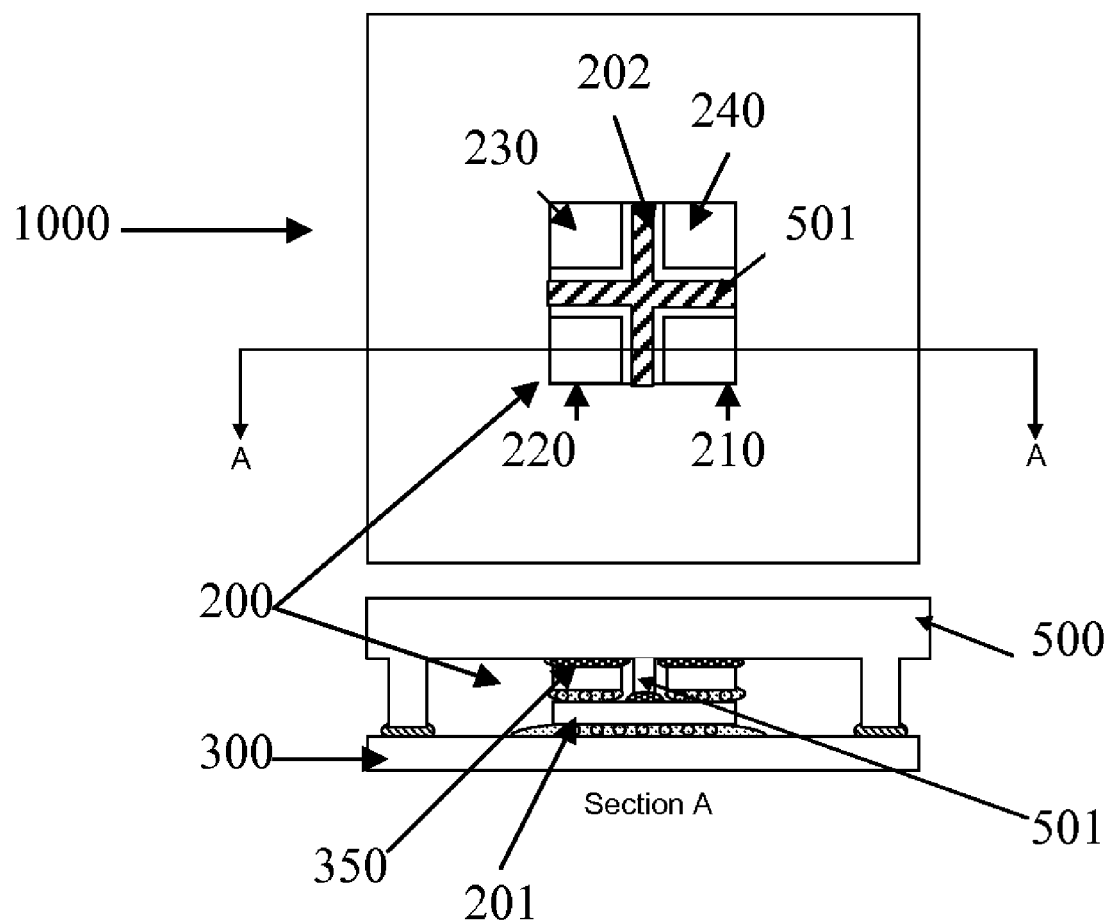
FIG. 5A shows top and cross-sectional views of an electronic package with a vertical die stack that is segmented and a lid according to an embodiment of the invention.
Figure 6:
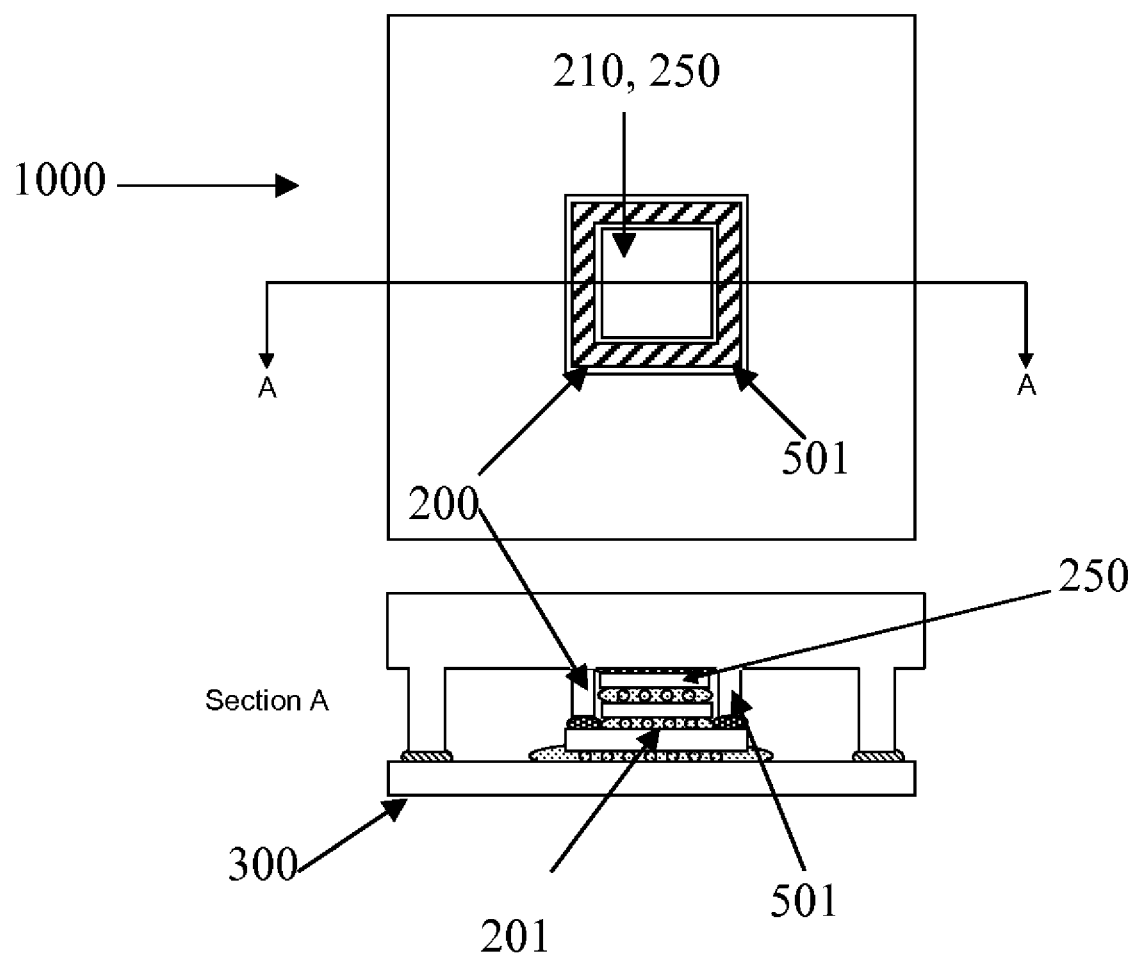
FIG. 6 shows top and cross-sectional views of an electronic package with a vertical die stack that is segmented according to another embodiment of the invention.

As an example, the second components 210-240 may be segmented into four portions, as shown in FIGS. 4A and 5A. Here, each of the portions may be disposed proximate to respective corners of the first component 201 with the footprint of the vacated region 202 being defined between the respective footprints of the portions.

Figure 4B:
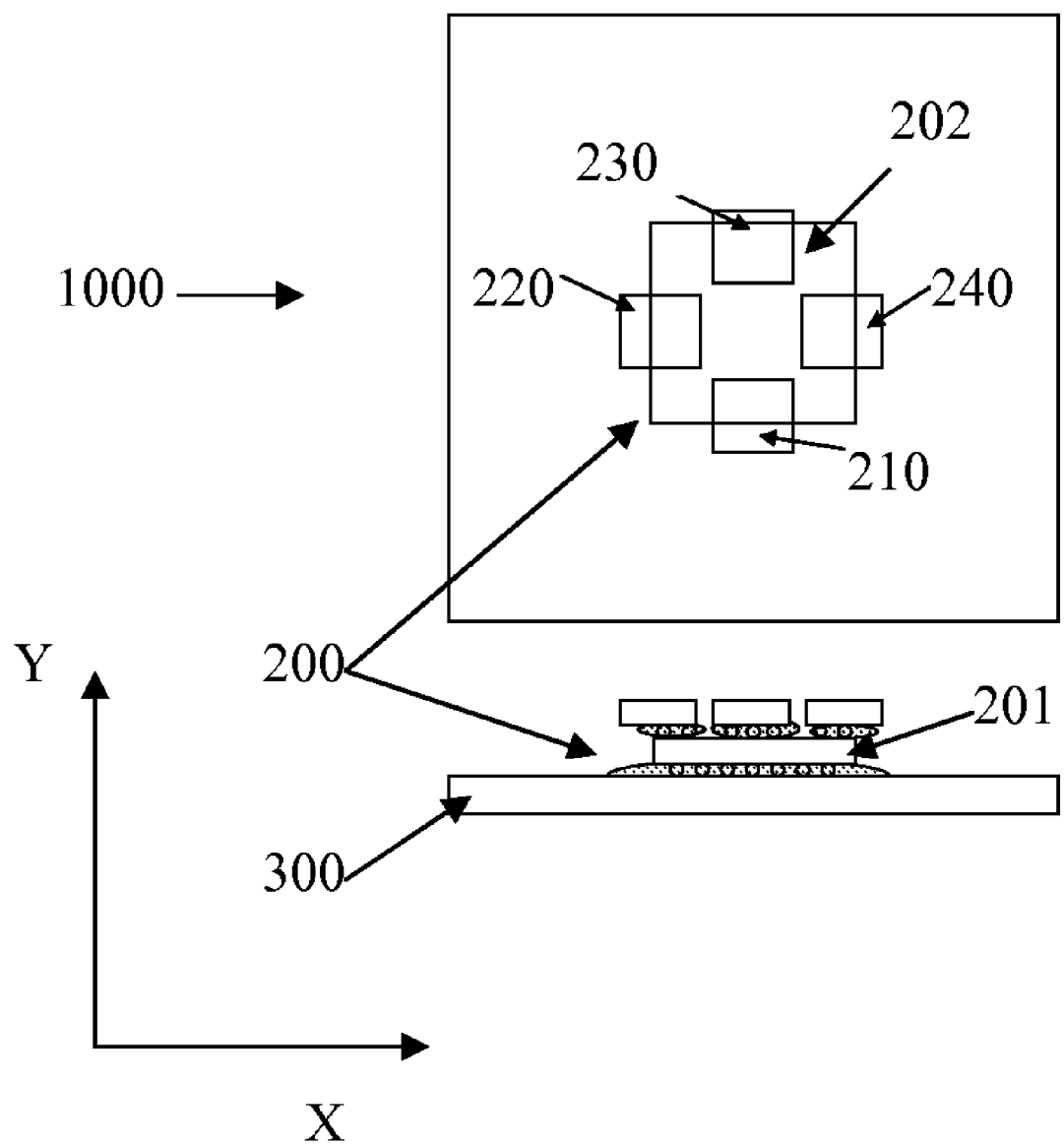
FIG. 4B shows top and cross sectional views of an electronic package with a vertical die stack that is segmented according to another embodiment of the invention.
Figure 5B:
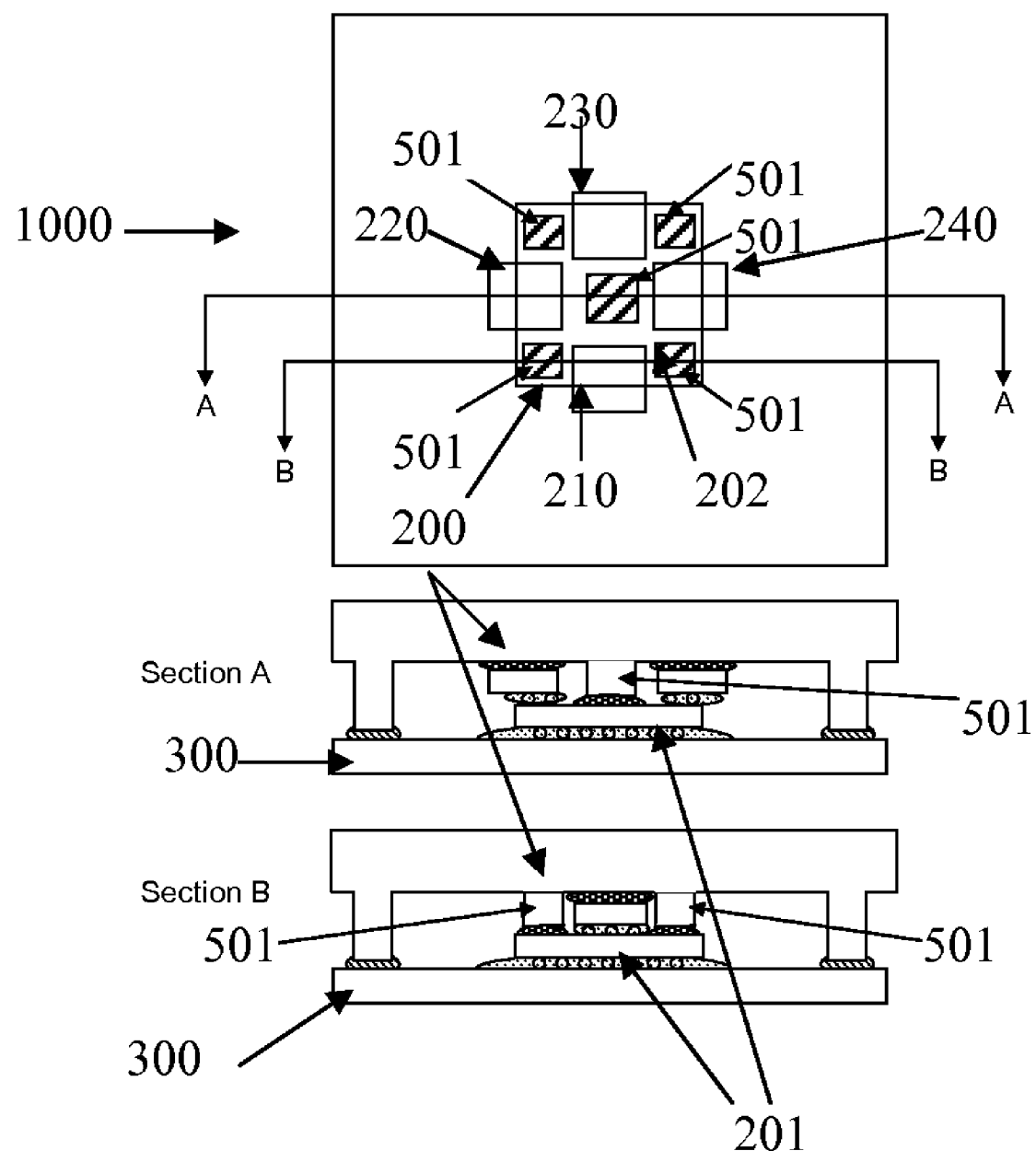
FIG. 5B shows top and cross sectional views of an electronic package with a vertical die stack that is segmented and a lid according to another embodiment of the invention.

As another embodiment and as shown in FIGS. 4B and 5B, each of the portions may be disposed proximate to respective edges of the first component 201 with the footprint of the vacated region 202 being defined between and alongside the respective footprints of the portions.

Figure 4C:
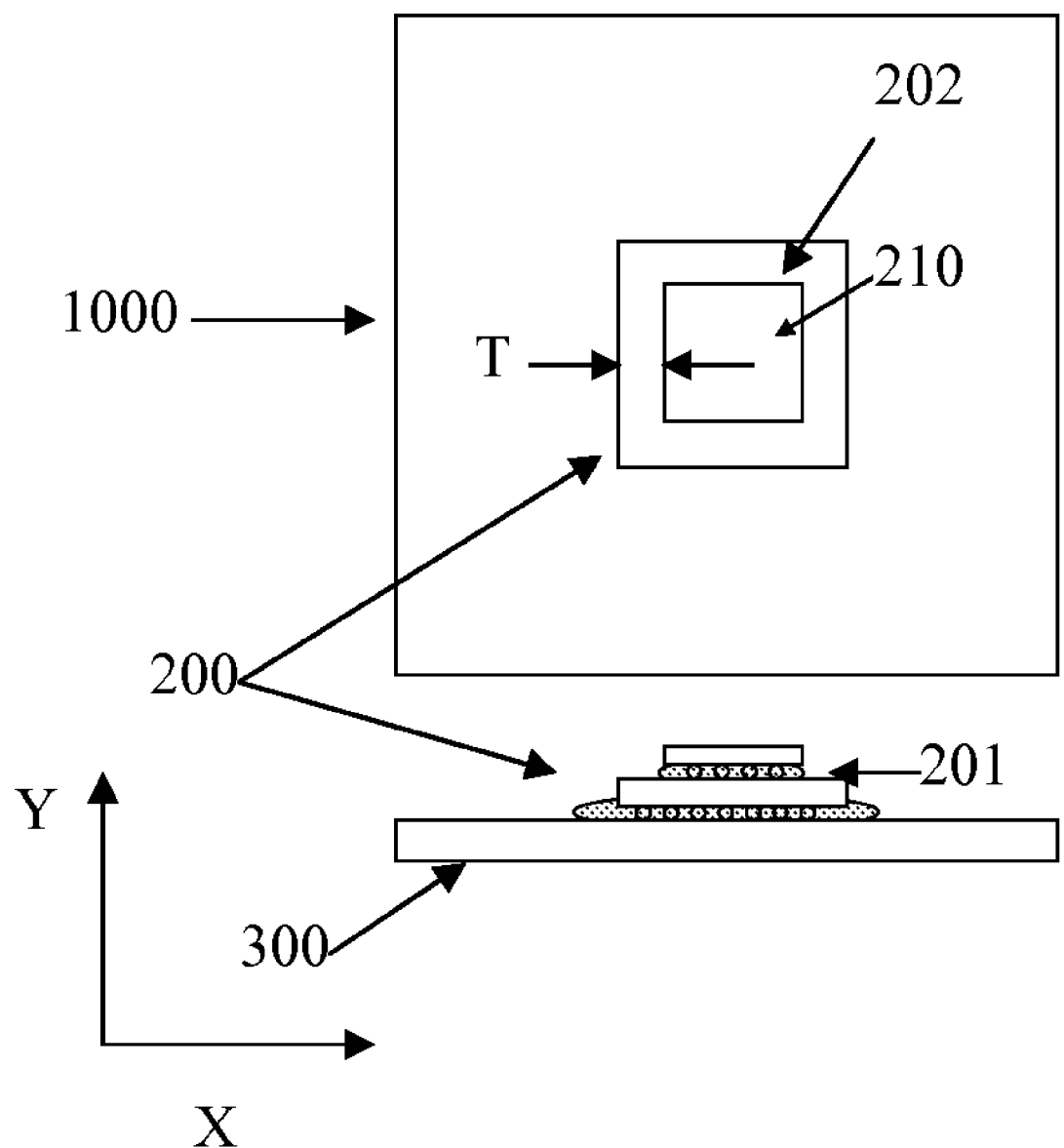
FIG. 4C shows top and cross-sectional views of an electronic package with a vertical die stack that is segmented according to another embodiment of the invention.
Figure 5C:
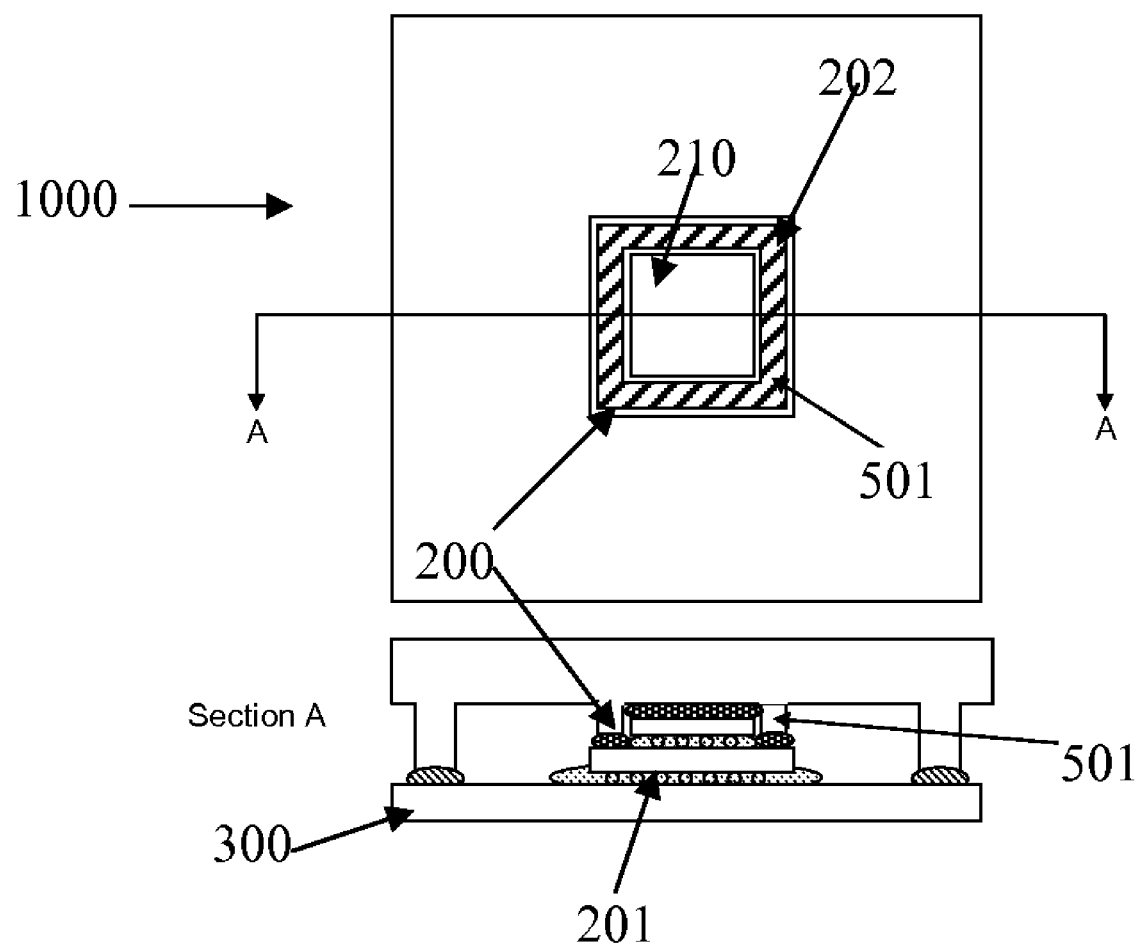
FIG. 5C shows top and cross-sectional views of an electronic package with a vertical die stack that is segmented and a lid according to another embodiment of the invention.

As an yet another example and as shown in FIGS. 4C and 5C, the second component 210 may be singular in number and may be segmented to be narrower in at least one planar direction than the first component 201. For example, each edge of the second component 210 may be withdrawn in the X-Y plane of the die stack 200 from edges of the first component 201 by a distance T. In this way, a footprint of the vacated region 202 is defined to be above an outer region of the footprint of the first component 201 and outside of a footprint of the second component 210. In a further embodiment of the invention, the distance T may be approximately 2 mm.

In addition to the use of the segmented second components 210-240, it is understood that additional embodiments of the invention are possible. For example, the apparatus 1000 may further include a cooling system to perform forced convection liquid cooling, in which coolant is pumped through the die stack 200. Similarly, a density of the C4 bumps may be increased. Of course, still further cooling options are available and may be applied to the die stack 200.

With reference now to FIG. 6 and as briefly discussed above, it is noted that the die stack 200 may include additional layers of components 250 applied above top surfaces of the second components 210-240. In accordance with this embodiment, the additional layers of components 250 may be segmented to reflect the segmentation of the second components 210-240 or, alternatively, may be segmented in a different pattern. For example, where a second component 210 is segmented in accordance with the embodiment of FIGS. 4C and 5C, the component 250 in an additional layer may be segmented according to the same pattern or in accordance with the embodiments of FIGS. 4A, 4B, 5A and 5B.

Where the die stack 200 includes additional layers of components 250 applied above top surfaces of the second components 210-240, it may be seen in some embodiments, that the components 250 do not extend over the vacated region 202 in the layer directly below it. As such, a construction of the protrusions 501, which extend into the vacated region 202, are relatively simplified.

Figure 7:
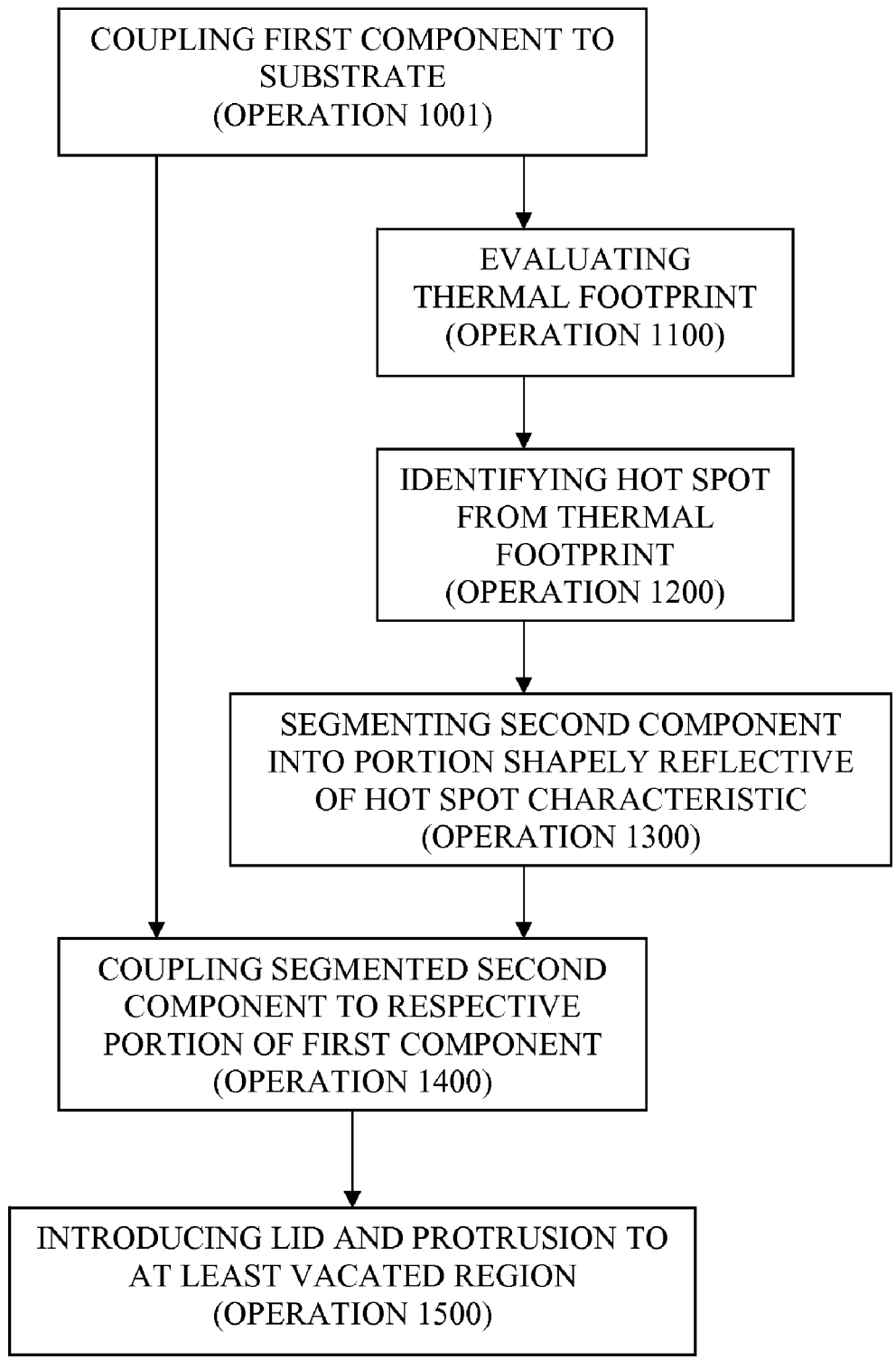
FIG. 7 is a flow diagram illustrating a method of forming a die stack in accordance with an embodiment of the present invention.

With reference now to FIG. 7, a design optimization method for assembly of a three-dimensional (3D) die stack 200 for use in a computing environment including a substrate 300 is provided. The method includes coupling a first component 201 to perform operations of the computing environment to the substrate 300 (operation 1001), coupling one or more segmented second components 210-240 to at least one respective portion of the first component 201 such that the segmented second component 210-240 forms a vacated region 202 (operation 1400), and introducing a lid 500 having a protrusion 501 to extend over the second components 210-240 and into at least the vacated region 202 (operation 1500).

Still referring to FIG. 7, the method may further include evaluating a thermal footprint of the first component 201 during initial ones of the operations (operation 1100), identifying a hot spot from the evaluated thermal footprint (operation 1200), and segmenting the second component 210-240 into at least one portion thereof which is shapely reflective of at least one of a shape and an intensity of the hot spot (operation 1300).

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

We claim:

1. An apparatus to reduce a thermal penalty of a three-dimensional (3D) die stack for use in a computing environment, comprising:
    a substrate installed within the computing environment;
    a first component to perform operations of the computing environment, which is coupled to the substrate in a stacking direction, which is normal to a plane of the substrate;
    a set of one or more second components to perform operations of the computing environment, each of which is stacked onto the first component in the stacking direction such that the first component is at least partially interposed between the substrate and the one or more second components along the stacking direction, and each of which is segmented with respect to one another to form a vacated region;
    a thermal interface material (TIM) disposed on exposed surfaces of the first and second components; and
    a lid, including a protrusion, coupled to the substrate to overlay the first and second components along the stacking direction such that the protrusion extends into the vacated region and such that surfaces of the lid and the protrusion thermally communicate with the first and second components via the TIM.

2. The apparatus according to claim 1, wherein the substrate comprises a printed circuit board (PCB).

3. The apparatus according to claim 1, wherein the first component comprises a processor.

4. The apparatus according to claim 1, wherein the second component comprises a memory unit, including at least one of static random access memory (SRAM) and dynamic random access memory (DRAM).

5. The apparatus according to claim 1, wherein the second component is singular in number and segmented so as to be narrower in at least one planar direction than the first component.

6. The apparatus according to claim 1, wherein the set of second components are segmented into four portions.

7. The apparatus according to claim 6, wherein each of the portions are disposed proximate to respective corners of the first component.

8. The apparatus according to claim 6, wherein each of the portions are disposed proximate to respective edges of the first component.

9. The apparatus according to claim 1, wherein the lid is configured to form an exterior appearance of the die stack.

10. A three-dimensional (3D) die stack, comprising:
    a first component;
    a set of one or more second components, each of which is stacked onto the first component in a stacking direction and segmented with respect to one another to form a vacated region;
    a thermal interface material (TIM) disposed on exposed surfaces of the first and second components; and
    a lid, including a protrusion, configured to overlay the first and second components in the stacking direction such that the second components are at least partially interposed between portions of the first component and portions of the lid along the stacking direction, such that the protrusion extends into the vacated region and such that surfaces of the lid and the protrusion thermally communicate with the first and second components via the TIM.

11. The apparatus according to claim 10, wherein the second component is singular in number and segmented so as to be narrower in at least one planar direction than the first component.

12. The apparatus according to claim 10, wherein the second component is segmented into four portions.

13. The apparatus according to claim 12, wherein each of the portions are disposed proximate to respective corners of the first component.

14. The apparatus according to claim 12, wherein each of the portions are disposed proximate to respective edges of the first component.

15. A three-dimensional (3D) die stack, comprising:
a first component;
a set of one or more second components, each of which is stacked onto the first component in a stacking direction and segmented with respect to one another to form a vacated region;
a set of one or more third components, each of which is stacked onto a respective second component in the stacking direction and segmented with respect to one another to form an additional vacated region;
a thermal interface material (TIM) disposed on exposed surfaces of the first, second and third components; and
a lid, including a protrusion, configured to overlay the first, second and third components in the stacking direction such that the second and third components are at least partially interposed between portions of the first component and portions of the lid along the stacking direction, such that the protrusion extends into the vacated region and the additional vacated region and such that surfaces of the lid and the protrusion thermally communicate with the first, second and third components via the TIM.

16. The apparatus according to claim 15, wherein:
the second component is singular in number and segmented so as to be narrower than the first component in at least one planar direction, or wherein:
the second components are plural in number and segmented into four portions, each of which is disposed proximate to respective corners of the first component or to respective edges of the first component.

17. The apparatus according to claim 16, wherein the third components are segmented in a similar fashion as the second components.

18. The apparatus according to claim 16, wherein the third components are segmented in a different fashion as the second components.

* * * * *